United States Patent [19]

Chou et al.

[11] Patent Number: 6,069,380
[45] Date of Patent: May 30, 2000

[54] SINGLE-ELECTRON FLOATING-GATE MOS MEMORY

[75] Inventors: Stephen Y. Chou, Golden Valley; Lingjie Guo, Minneapolis, both of Minn.; Effendi Leobandung, Fishkill, N.Y.

[73] Assignee: Regents of the University of Minnesota, Minneapolis, Minn.

[21] Appl. No.: 08/900,947

[22] Filed: Jul. 25, 1997

[51] Int. Cl.⁷ ............................................. H01L 29/788
[52] U.S. Cl. .......................... 257/315; 438/257; 438/264
[58] Field of Search ............................ 257/315; 438/257, 438/264

[56] References Cited

U.S. PATENT DOCUMENTS

| | | | |
|---|---|---|---|
| 4,272,744 | 6/1981 | Boettcher | 357/23 |
| 4,581,621 | 4/1986 | Reed et al. | 357/12 |
| 5,093,699 | 3/1992 | Weichoid et al. | 357/22 |
| 5,446,299 | 8/1995 | Acovic et al. | 257/316 |
| 5,493,140 | 2/1996 | Iguchi | 257/316 |
| 5,508,543 | 4/1996 | Hartstein et al. | 257/314 |
| 5,581,102 | 12/1996 | Kusumoto | 257/347 |
| 5,670,790 | 9/1997 | Katoh et al. | 257/14 |
| 5,740,104 | 4/1998 | Forbes | 365/185.03 |

FOREIGN PATENT DOCUMENTS

PCT/US97/ 13348  11/1997  WIPO.

OTHER PUBLICATIONS

Lingjie Guo et al., "A Silicon Single–Electron Transistor Memory Operating at Room Temperature," Science, vol. 275, p. 649–651(Jan. 31, 1997).

Kazuo Yano et al., "Room Temperature Single–Electron Memory," IEEE Transactions on Electron Devices, vol. 41, No. 9, p. 1628–1637 (Sep. 1994).
Sandip Tiwari et al., "A Silicon Nanocrystals Based Memory," App. Phys. Lett., vol. 68 (10), p. 1377–1379 (Mar. 4, 1996).
P. B. Fischer et al., "10 nm Electron Beam Lithography and Sub–50 nm Overlay Using a Modified Scanning Electron Microscope," Appl. Phys. Lett., vol. 62 (23), p. 2989–2991 (Jun. 7, 1993).
Paul B. Fischer et al., "10 nm Si Pillars Fabricated Using Electron–beam Lithography, Reactive Ion Etching, and HF Etching," J. Vac. Sci. Technol., vol. B 11(6), p. 2524–2527 (Nov./Dec. 1993).

(List continued on next page.)

*Primary Examiner*—Olik Chaudhuri
*Assistant Examiner*—Howard Weiss

[57] ABSTRACT

A Single Electron MOS Memory (SEMM), in which one bit of information is represented by storing only one electron, has been demonstrated at room temperature. The SEMM is a floating gate Metal-Oxide-Semiconductor (MOS) transistor in silicon with a channel width (about 10 nanometers) which is smaller than the Debye screening length of a single electron stored on the floating gate, and a nanoscale polysilicon dot (about 7 nanometers by 7 nanometers by 2 nanometers) as the floating gate which is positioned between the channel and the control gate. An electron stored on the floating gate can screen the entire channel from the potential on the control gate, and lead to: (i) a discrete shift in the threshold voltage; (ii) a staircase relation between the charging voltage and the shift; and (iii) a self-limiting charging process. The structure and fabrication of the SEMM is well adapted to the manufacture of ultra large-scale integrated circuits.

5 Claims, 7 Drawing Sheets

OTHER PUBLICATIONS

Effendi Leobandung et al., "Single Electron and Hole Quantum Dot Transfers Operating Above 110 K," J. Vac. Sci. Technol., vol. B 13 (6), p. 2865–2868 (Nov./Dec. 1995).

S. M. Sze, "Physics of Semiconductor Devices," 2nd Ed., John Wiley & Sons, p. 496–506 (1981).

Philip Yam, "Dot's Incredible," Scientific American, pp. 14–15 (Nov. 1993).

Peter Kauffner, "Professor's Innovation Captures Attention," The Minnesota Daily, vol. 98, Issue 74, p. 1, 9 (Feb. 5, 1997).

H.I. Liu et al., "Self–Limiting Oxidation for Fabricating sub5–nm Silicon Nanowires," Applied Phys. Let., vol. 64, p. 1383 (Mar. 14, 1994).

J.R. Davis, "Instabilities in MOS Devices," Gorden & Breach Science Publishers, pp. 20–21 (1980).

Stephen Gasiorowicz, "Quantum Physics," John Wiley & Sons, pp. 60–64, 78–79, 151–152 (1974).

Stephen Y. Chou et al., "Imprint Lithography With 25–Nanometer Resolution," Science, vol. 272, p. 85 (Apr. 5, 1996).

D. Ali & H. Ahmed, "Coulomb Blockade in a Silicon Tunnel Junction Device," Appl. Phys. Lett., vol. 64 (16), p. 2119 (Apr. 18, 1994).

Y. Takahashi et al., "Conductance Oscillations of a Si Single Electron Transistor at Room Temperature," IEDM 94, p. 938 (33.7.1) (1994).

E. Leobandung et al., "Observation of Quantum Effects and Coulomb Blockade in Silicon Quantum–Dot Transistors at Temperatures Over 100 K," Appl. Phys. Lett., vol. 67 (7), p. 938 (Aug. 14, 1995).

E. Leobandung et al., "Silicon Single Hole Quantum Dot Transistors for Complementary Digital Circuits," IEDM 95, p. 367 (15.2.1) (1995).

6,069,380

SINGLE-ELECTRON FLOATING-GATE MOS MEMORY

I. PATENT RIGHTS STATEMENT

This invention was partially funded by the Department of the Navy (Grant Nos. N/N00014-96-1-0160; N/N00014-93-1-0882; N/N00014-96-1-0788), the Department of the Army (Grant No. DA/DAAH04-95-1-0327), and the National Science Foundation (Grant No. ECS-9522201). The Government may have certain rights in this invention.

II. TECHNICAL FIELD

This invention relates generally to a data storage device, and more specifically to a data storage device capable of representing a bit of information (i.e., a logic '0' or a logic '1') by storing and detecting a single charge carrier during room-temperature operation.

III. BACKGROUND OF THE INVENTION

To increase the storage density of semiconductor memories, the size of memory cells must be reduced. Smaller memory cells also lead to faster speeds and lower power consumption.

A widely-used semiconductor memory is the "floating gate" memory. A floating gate memory has a floating gate interposed between a channel and a control gate. Information is represented by storing a plurality of charges (e.g., hundreds of thousands) on the floating gate. The information stored in a floating gate memory can be determined because differing amounts of charge on the floating gate will shift the threshold voltage of the transistor. A relatively low threshold voltage (e.g., no excess charges on the floating gate) can be used to represent a stored logic '0', and a relatively high threshold voltage (e.g., a plurality of charges on the floating gate) can be used to represent a stored logic '1.' For a detailed discussion of floating gate memories, the reader is referred to S. M. Sze, "Physics of Semiconductor Devices," John Wiley & Sons, pp. 496–497 (1981), which is incorporated into this application by reference in its entirety.

Recently, MOS memory cells have been fabricated which are capable of storing and detecting the presence or absence of a single charge to represent either a logic '1' or logic '0.' A device capable of this feat is referred to as a Single Electron MOS Memory (SEMM).

A previous SEMM design, disclosed in Kazuo Yano et al., "Room-Temperature Single-Electron Memory," IEEE Trans. Elec. Devices, Vol. 41, No. 9, pg. 1628 (September 1994), uses a tiny polysilicon strip which forms the source-to-drain path of the SEMM to store a discrete number of charges. An electron percolation path in the polysilicon strip forms the channel of the device, and one of the polysilicon grains next to the conduction path can act essentially in the same manner as a floating gate. However, because this structure relies on the polysilicon grain structure of the source-to-drain path as the storage medium, it inherently prevents a precise control of the channel size, the floating gate dimension, and the tunnel barrier.

In another previous SEMM design, disclosed in Sandip Tiwari, "A Silicon Nanocrystals Based Memory," App. Phys. Letters, Vol. 68, No. 10, pg. 1377 (March 1996), a conventional floating gate is replaced with a plurality of nanocrystal grains in a traditional floating gate memory. However, utilizing this approach, the size of the silicon nanocrystals forming the plurality of floating gates and the tunnel barriers associated with each floating gate will have an inherently broad distribution.

While both of these previous approaches strive to alleviate the challenges presented by nanofabrication (i.e., the fabrication of structures approaching the size of a nanometer), both rely on the use of statistically variant floating gate structures which lead to undesirable fluctuations in threshold voltage shifts and in the charging voltage, therefore making such structures unsuitable for large-scale integration. A commercially practical SEMM would require a voltage for charging a single electron to a floating gate to be discrete and well separated, and to result in a sufficient and predictable threshold voltage shift when a single electron is stored.

IV. SUMMARY OF THE INVENTION

The present invention provides a Single Electron MOS Memory (SEMM) capable of representing a bit of information (i.e., a logic '0' or a logic '1') by storing and detecting a single charge carrier during room temperature operation.

According to one aspect of the invention, the SEMM comprises a source-to-drain path with a channel region; a single floating gate for storing at least one charge carrier, the floating gate being disposed over the channel region and isolated from the channel region by a first gate dielectric layer; and a control gate disposed over the floating gate and isolated from the floating gate by a second gate dielectric layer so that a single charge carrier on the floating gate at room temperature produces a significant shift in threshold voltage of the channel region with respect to the control gate.

According to another aspect of the invention, the SEMM comprises a semiconductor source-to-drain path which includes a channel region; a single floating gate disposed over the channel region and isolated from the channel region by a first gate dielectric layer, the floating gate having dimensions less than 10 nanometers (nm) by 10 nanometers by 10 nanometers for storing a single charge carrier; and a control gate disposed over the floating gate and isolated from the floating gate by a second gate dielectric layer. The width of the source-to-drain path is smaller than the Debye screening length of the single charge carrier stored on the floating gate.

According to another aspect of the invention, the SEMM comprises a source-to-drain path including a channel region having a width of less than 70 nanometers; a single floating gate disposed over the channel region and isolated from the channel region by a first gate dielectric layer, the floating gate having dimensions less than 10 nanometers by 10 nanometers by 10 nanometers for storing a single charge carrier; and a control gate disposed over the floating gate and isolated from the floating gate by a second gate dielectric layer.

According to another aspect of the invention, the SEMM comprises a source-to-drain path including a channel region between a source and a drain, the channel region being a semiconductor, the channel region having a length from the source to the drain and also having a width; a floating gate for storing at least one charge carrier, the floating gate being disposed over the channel region and isolated from the channel region by a first gate dielectric layer, the floating gate having a width, wherein the width of the floating gate is self-aligned with the width of the channel; and a control gate disposed over the floating gate and isolated from the floating gate by a second gate dielectric layer.

According to another aspect of the invention, the SEMM comprises a source-to-drain path including a channel region between a source and a drain, the channel region being comprised of a semiconductor; a floating gate for storing at least one charge carrier, the floating gate being disposed over the channel region and isolated from the channel region by a first gate dielectric layer, the floating gate having lateral dimensions defined by lithography; and a control gate disposed over the floating gate and isolated from the floating gate by a second gate dielectric layer so that a single charge carrier on the floating gate at room temperature produces a significant shift in threshold voltage of the channel region with respect to the control gate.

The SEMM of the invention solves the problems encountered with previous SEMM designs. The charging of the floating gate with a single charge carrier leads, at room temperature, to a quantized threshold voltage shift and a staircase relation between the shift and the charging voltage. Furthermore, the charging process is self-limited.

V. BRIEF DESCRIPTION OF THE DRAWINGS

VI. DESCRIPTION OF ILLUSTRATIVE EMBODIMENTS

Figure 1:
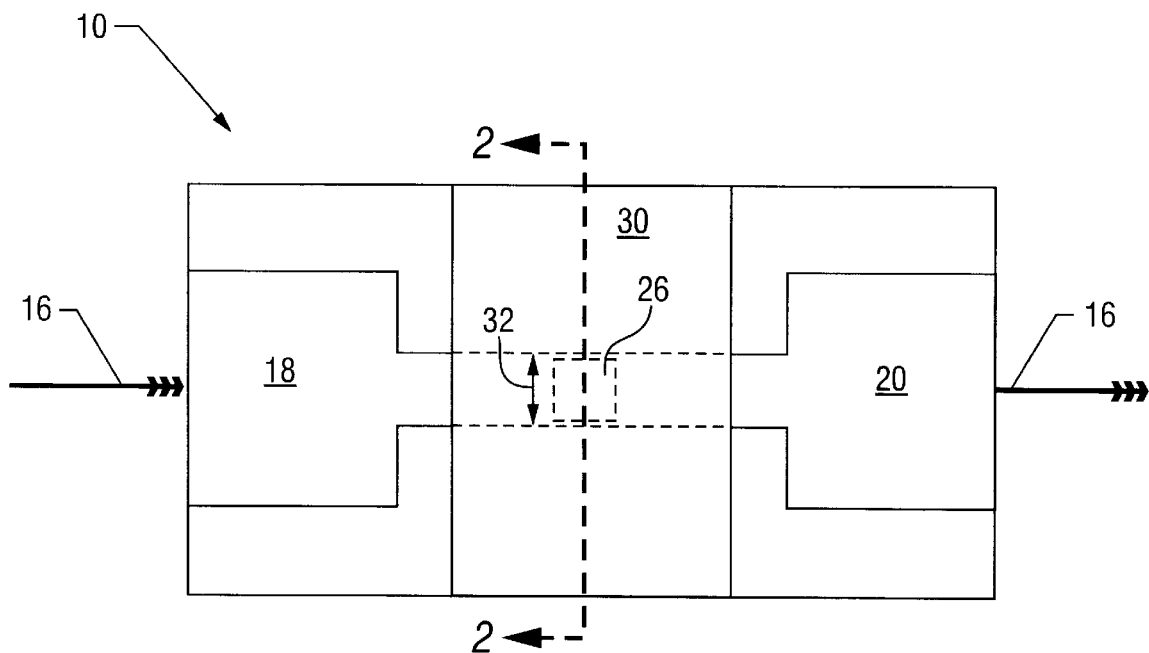
FIG. 1 shows a top-down view of the basic structure of a SEMM according to the present invention.
Figure 2:
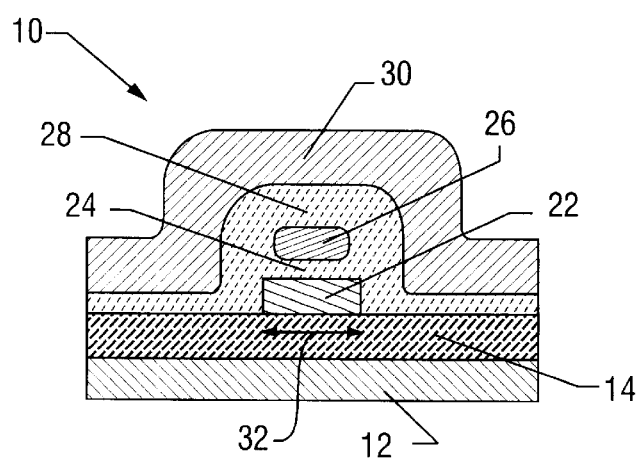
FIG. 2 shows a cross-sectional view of the structure of FIG. 1 along a source-to-drain path.

FIGS. 1 and 2 show the disclosed inventive SEMM 10. The SEMM is comprised of: a crystalline silicon substrate 12; a buried oxide layer 14; a source-to-drain path 16 including a source 18, a drain 20, and a channel region 22; a gate oxide 24; a nanoscale floating gate or "dot" 26; a control gate oxide 28; and a control gate 30.

The SEMM's channel width 32 is narrower than the Debye screening length of a single electron stored on the floating gate 26. Therefore, the storage of a single electron on the floating gate 26 is sufficient to screen the entire channel (i.e., the full channel width 32) from the potential ($V_{cg}$) on the floating gate. The storage of a single electron produces a significant shift in the SEMM's threshold voltage.

The small floating gate 26 significantly increases the quantum energy of the electron stored on the floating gate, a necessary constraint for room-temperature operation. At the same time, the small capacitance of the gate oxide 24 relative to the control gate oxide 28 allows for a sufficiently high charging voltage ($V_{charge}$) such that the threshold voltage ($V_t$) shift caused by an electron stored on the floating gate 26 and $V_{charge}$ become well separated at room temperature. While the device's control gate 30 (and therefore the channel region 22) can be relatively long, the device's threshold voltage is determined by the section where the floating gate 26 is located over the channel region 22.

A. Fabrication:

The SEMM 10 can be fabricated using a silicon-on-insulator or SIMOX wafer 11 which comprises crystalline silicon 12 and a buried oxide layer 14. The buried oxide layer 14 is formed within the crystalline silicon 12 by high-energy ion implantation of oxygen, which leaves a 300–1000 nanometer thick surface layer 13 of crystalline silicon on top of the buried oxide layer 14. An anneal follows the ion implantation of oxygen to heal dislocations formed in the surface layer 13 as a result of the implantation. Depending on the implant energy used, the buried oxide layer 14 can be about 23 microns thick, although this thickness is not critical. A suitable wafer 11 pre-processed as described above can be purchased from IBIS, Inc., at 75 Arlington Street, Boston, Mass., 02116. However, to tailor such a suitable wafer for use in fabricating the disclosed SEMM 10, it is necessary to thin the surface layer 13 of crystalline silicon to about a 30–50 nanometers thickness. This can be performed by oxidizing the surface layer 13 in an oxygen ambient to consume as much of the surface layer 13 as necessary to achieve the proper thickness. The oxidized surface layer 13 is then removed by using a hydrofluoric acid wet etch. The surface layer 13 should be lightly doped to a concentration level of about $1 \times 10^{14}$ to $1 \times 10^{19}$ atoms/cm$^3$ (about $1 \times 10^{14}$ atoms/cm$^3$ is suitable) with a suitable P-type dopant such as boron. The surface layer 13 will eventually be etched to form the source-to-drain path 16, including the channel region 22, of the SEMM 10. While the use of a commercially available SIMOX wafer 11 is preferred, other Silicon on Insulator (SOI) technologies (such as Silicon on Sapphire (SOS) or mechanical bonding of crystalline silicon to a insulting substrate) are also suitable.

After removal of the excess surface layer 13, the gate oxide 24 is formed. For reasons to be clarified later, it is desirable to make the gate oxide very thin, on the order of about 1 nanometer. This can be achieved by exposing the etched surface layer 13 to an air ambient for about a day or two. The oxygen present in the air will react with the silicon in surface layer 13 to produce about 1 nanometer of oxide. Because this oxidation process is largely self-limiting, the exact time necessary to form the 1 nanometer is not critical.

Figure 3:
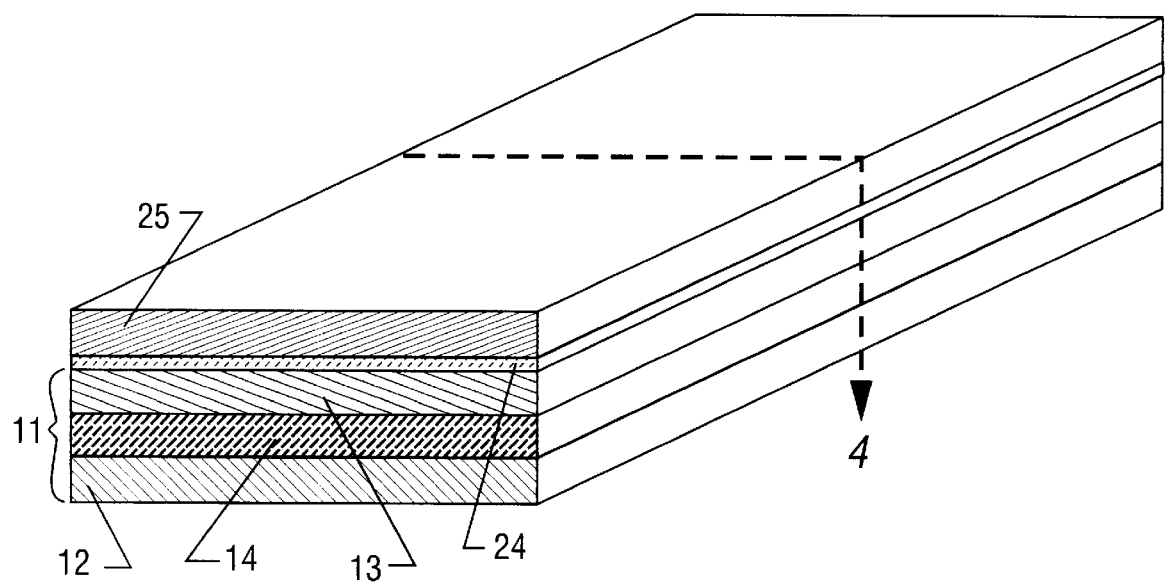
FIG. 3 shows an isometric view of a crystalline silicon substrate, a buried oxide layer, a surface layer, a gate oxide, and a first poly layer prior to a first lithographic step in the fabrication of the SEMM of FIG. 1.
Figure 4:
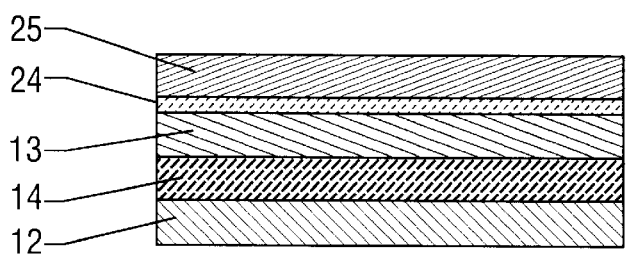
FIG. 4 shows a cross-sectional view of the structure of FIG. 3.

Next, a first updoped layer of polycrystalline silicon ("polysilicon" or "poly") 25 is deposited on top of the gate oxide 24 to a thickness of about 11 nanometers. The first poly layer 25 will eventually be patterned and etched to form the floating gate 26. The first poly layer 25 is preferably deposited using a Low-Pressure-Chemical-Vapor-Deposition (LPCVD) process which uses a silane ($SiH_4$) source gas. Suitable poly LPCVD processes are well known to those of ordinary skill in the art. FIGS. 3 and 4 show the resulting structure after the completion of the above processing steps.

Next, the resulting structure is patterned and etched to form the source-to-drain path 16. Because the channel width 32 and the floating gate 26 must be very small, Electron Beam Lithography (EBL) is used during the patterning process. A suitable polymethymethacrylate (PMMA) resist (such as 950 K PMMA or other resist of a suitably low molecular weight) is deposited on the surface of the first poly layer 25 to a thickness of about 45 nanometers by spinning a 1.6% solution of PMMA (in chlorobenzine) at 6000 revolutions-per-minute for 60 seconds. The resulting structure is then baked for 12 hours at 165 degrees Celsius to harden the PMMA resist. The PMMA resist is then exposed by an electron beam in the areas outside of the desired source-to-drain path 16 to degrade the PMMA so that it can be removed or "developed" in these areas. Development can be accomplished by rinsing the exposed resist at 23 degrees Celsius in 2-ethoxyethanol:methonol (3:7) for 7 seconds, followed by methanol for 10 seconds, followed by isopropanol for 30 seconds.

A suitable EBL system consists of a modified JEOL-840A Scanning Electron Microscope (SEM) with a tungsten filament gun which is equipped with a magnetic beam blanking unit and an electronic rotation system. Such a system is capable of producing a electron beam spot size of 3–4 nanometers and patterning a line width in the resist of about 20 nanometers.

During fabrication of the SEMM 10, this EBL system is used to pattern the source-to-drain path 16 to leave a line width of about 25 nanometers of resist in the channel region 22 of the device.

As an alternative to using EBL, nanoimprint technology can also be used to pattern the 25 nanometer line width. This technique involves making a mold containing the desired patterns to be etched and pressing it into the resist to leave an imprint of the pattern. Then, an etchant is used to etch the resist to expose the regions underneath the resist that that were recessed by the mold. Such a technique is disclosed in Stephen Y. Chou et al., "Imprint Lithography with 25-Nanometer Resolution," Science, Vol. 272, pg. 85 (Apr. 5, 1996), which is incorporated into this application by reference in its entirety.

Figure 5:
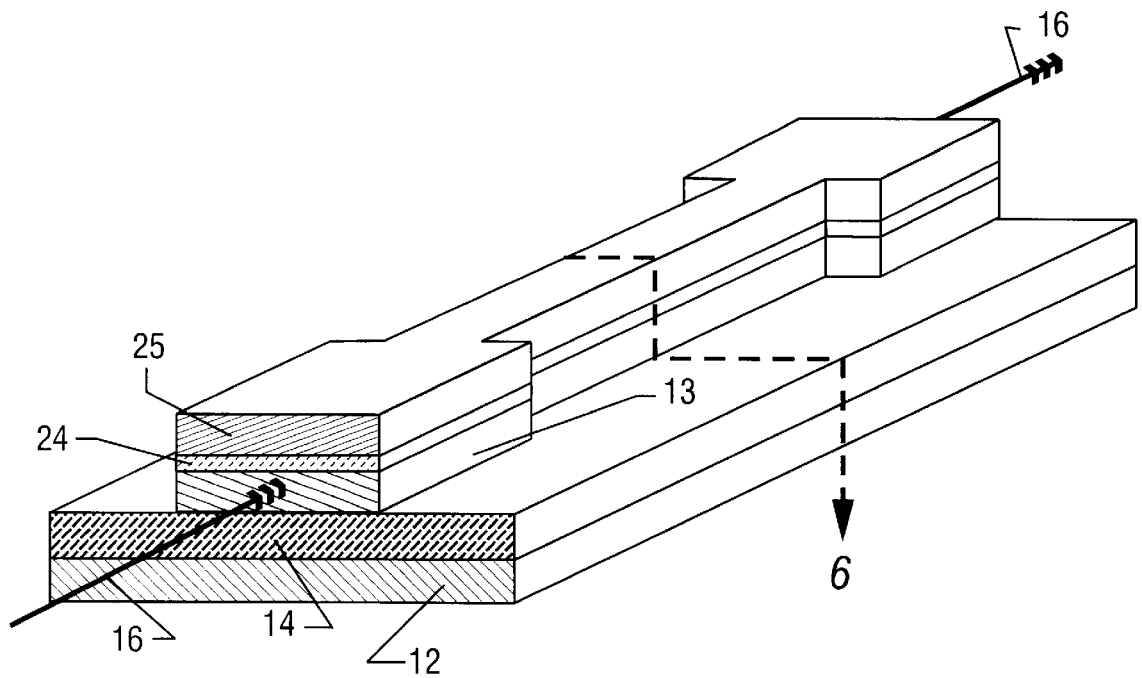
FIG. 5 shows an isometric view of the structure of FIG. 3 after the source-to-drain path is defined by the first lithographic step in the fabrication of the SEMM of FIG. 1.
Figure 6:
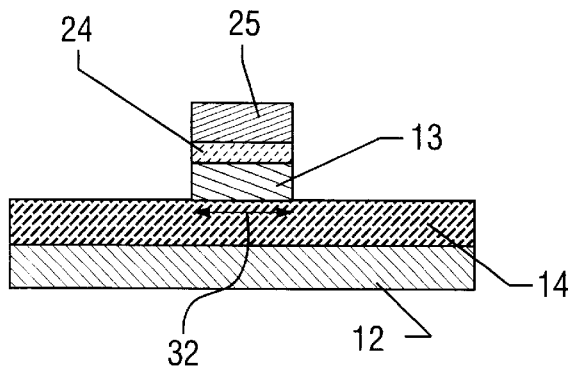
FIG. 6 shows a cross-sectional view of the structure of FIG. 5.

Next, the resulting structure is anisotropically etched using Reactive-Ion-Etching (RIE) to etch the first poly layer 25, the gate oxide 24, and the surface layer 13. Etching is performed using a parallel plate RIE system operated at 13.56 MHz, with $Cl_2$ and $SiCl_4$ flow rates of 55 and 10 sccm, respectively, a power density of 0.32 $W/cm^2$, a pressure of 40 mTorr, and a self-bias of −85 Volts. This produces a silicon etch rate of about 150 nanometers/minute. While the etching process as disclosed will etch silicon (i.e., the first poly layer 25 and the surface layer 13) at least ten times faster than oxides (i.e., the gate oxide 24), the process can also be used to remove the very thin layer of gate oxide 24. The etch time merely needs to be adjusted to account for the extra time needed to etch through the gate oxide 24. Also, the etching process as disclosed will etch silicon (i.e., the first poly layer 25 and the surface layer 13) at least ten times faster than the PMMA resist. Thus, using the thicknesses disclosed, a sufficient amount of PMMA will be left over the source-drain path 16 and will protect the underlying first poly layer 25 from being inadvertently etched. After etching, the PMMA resist can be removed by first soaking the resulting structure in warm acetone and later spraying the structure with a pressurized acetone jet. Because the first poly layer 25 and the channel region 22 are etched using the same photoresist mask, the width of the floating gate 26 (to be formed from the first poly layer 25) and the width 32 channel region 22 (formed from surface layer 13) are self-aligned with respect to one another. FIGS. 5 and 6 show the resulting structure after the completion of the above processing steps.

Figure 7:
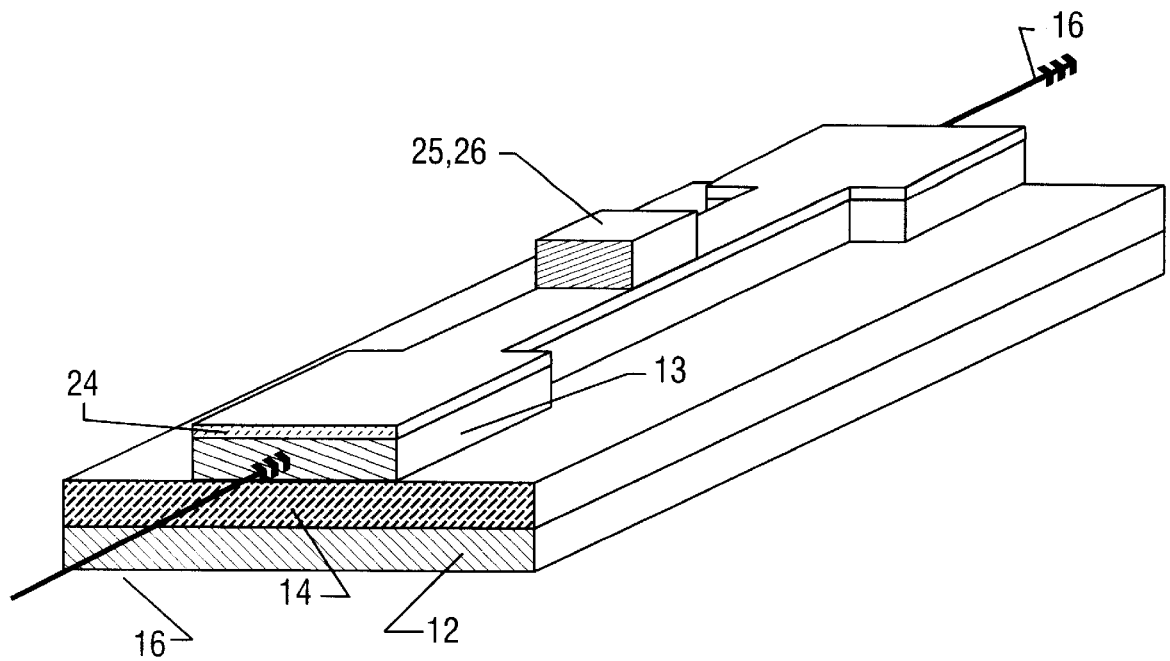
FIG. 7 shows an isometric view of the structure of FIG. 5 after the first poly layer is etched to form the floating gate.

Next, the floating gate 26 is formed from the remaining first poly layer 25. This can be accomplished by using the same patterning and etching steps that were used to form the source-to-drain path 16 as described above, except that the poly etch time needs to be adjusted to stop the etch after the gate oxide 24 surface has been reached. After the etch, the lateral area of the floating gate 26 will be about 25 nanometers by 25 nanometers. FIG. 7 shows the resulting structure after the completion of the above processing steps.

After the floating gate 26 has been etched and the PMMA resist removed, the resulting structure is then oxidized preferably in an ambient containing 100% oxygen for about 12 minutes at 900 degrees Celsius, atmospheric pressure, to form thermal oxide 27. The purpose of this oxidation step is three-fold: first, the high temperature of the oxidation process helps to anneal any damage to the surface layer 13 that might have resulted from the previous etching steps; second, the oxidation of the floating gate 26 will cause the polysilicon in the floating gate to oxidize, thus reducing its size to suitably quantize the energy levels of a single charge carrier on the floating gate; and third, the oxidation on the top of the floating gate 26 comprises a portion of the control gate oxide 28 (to be described in more detail later). The oxidation step should consume about 9 nanometers from each of the exposed surfaces of the 25 nanometers by 25 nanometers by 11 nanometers patterned floating gate 26, thus reducing its size after oxidation to about 7 nanometers by 7 nanometers by 2 nanometers. Of course, one of ordinary skill will recognize that self-limiting oxidation, as discussed in H. I. Liu et al, "Self-Limiting Oxidation for Fabricating sub-5 nm Silicon Nanowires," Applied Physics Letters, Vol. 64, pg. 1383 (1994), makes it difficult to assess the exact size of the resulting floating gate 26. The channel region 22 will also be oxidized by this process, although at a slightly slower rate than the floating gate 26, achieving a final channel width 32 of about 10 nanometers. Because the oxidation of silicon will form a resulting oxide film which is about twice the thickness of the silicon consumed by the oxidation, the thermal oxide 27 on the top and sides of the floating gate will be about 18 nanometers thick.

While the oxidation times, temperatures, gas concentrations, and gas flow rates as disclosed achieve the goals of fabricating a sufficiently small floating gate 26 and annealing prior etching damage, these parameters can be modified if necessary. For example, if longer heat treatments are needed to heal etch damage than are required to oxidize the floating gate, nitrogen can be added to the oxygen ambient to retard oxidation.

Figure 8:
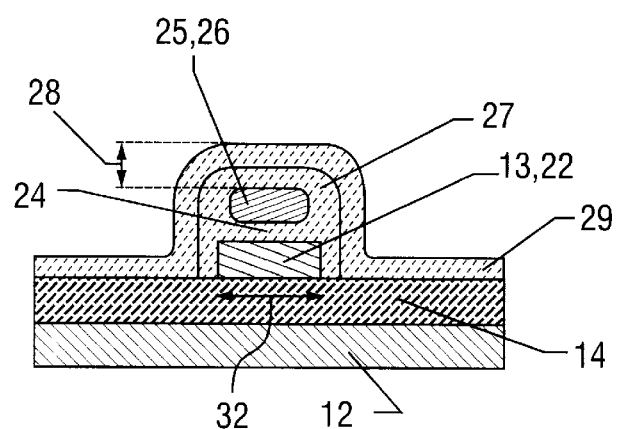
FIG. 8 shows a cross-sectional view of the structure of FIG. 7 after the formation of thermal oxide and the deposition of additional oxide.

Next, an oxide 29 is deposited on the resulting structure to a thickness of 22 nanometers using a commercially available Plasma-Enhanced-Chemical-Vapor-Deposition (PECVD) system. Oxide 29, when combined with the 18 nanometers of thermal oxide 27 already present on the top and sides of the floating gate 26 as a result of the previous oxidation step, produces a control gate oxide 28 which is about 40 nanometers thick. FIG. 8 shows the resulting structure after the completion of the above processing steps.

Next, a second undoped layer of poly 31 is deposited on top of the control gate oxide 28. The thickness of the second poly layer 31 is not critical and can be, for example, 100 to 500 nanometers thick. Otherwise, the second poly layer 31 is deposited using the same process used to deposit the first poly layer 25. The second poly layer 31 is then patterned and etched to form the control gate 30. Because the lateral dimensions of control gate 26 can be relatively large (e.g., about 1 to 3 microns), it can be patterned with optical lithography processes currently in use in the production of modern-day semiconductor circuits. Such optical lithography processes are easily capable of patterning resist line widths of less than a micron and are well known to those of ordinary skill in the art. After patterning, the second poly layer 31 can be etched using the poly etch recipe disclosed above, with the etch time adjusted to account for the extra thickness of the second poly layer 31. The length of the control gate will ultimately define the extent of the channel region 22 of the SEMM device. Also, the width of the control gate 30 is not critical, but is preferably made to run over the sides of the floating gate 26.

Figure 9:
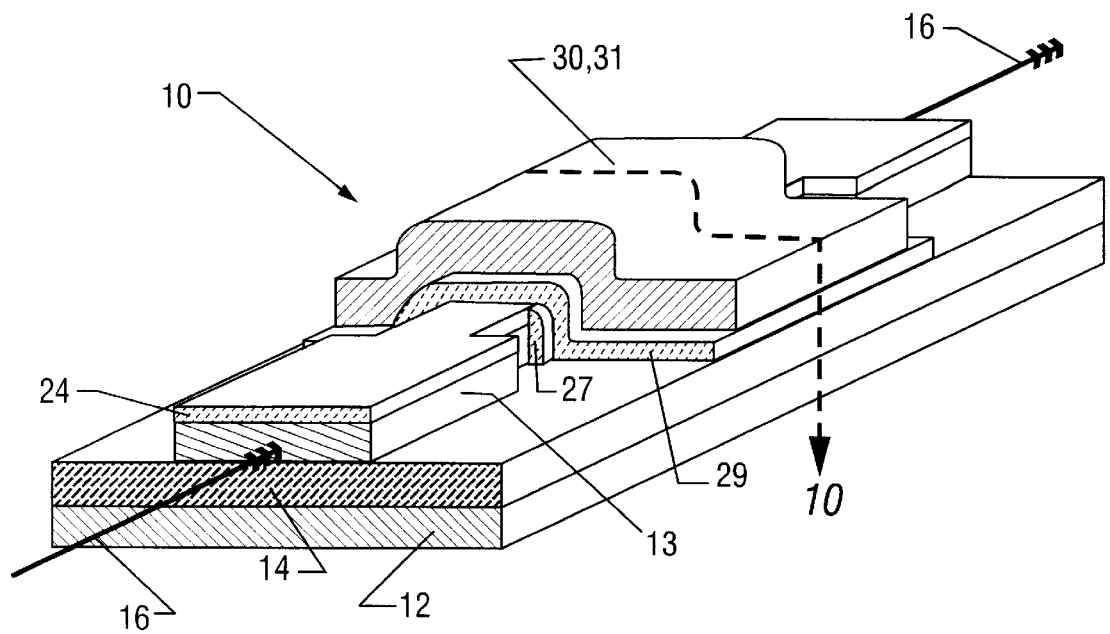
FIG. 9 shows an isometric view of the structure of FIG. 8 after the deposition of a second poly layer and the formation of the control gate from the second poly layer.
Figure 10:
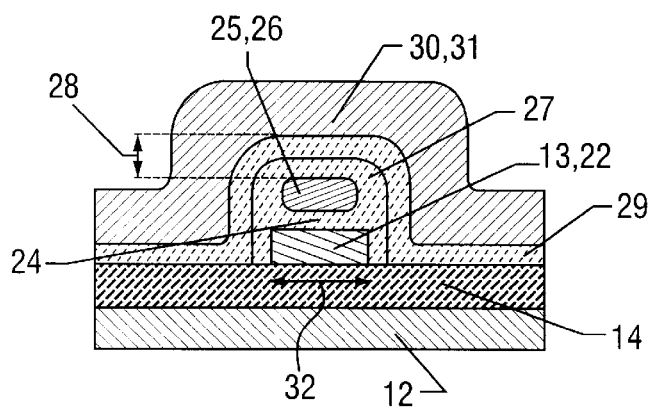
FIG. 10 shows a cross-sectional view of the structure of FIG. 9.

Next, the resulting structure is ion implanted with arsenic (an N-type dopant) to dope the exposed regions of the source-to-drain path 16 and the control gate 30. This doping step has a two-fold purpose; first, it dopes the control gate 30 to render it sufficiently conductive to carry signals without undue resistance; and second, it dopes the exposed portions of the source-to-drain path 16 in those regions not covered by the control gate 30 to form source 18 and drain 20. The resulting undoped region of the source-to-drain path 16 (i.e., the region "masked" by the control gate 30) constitutes the channel region 22 of the device. While the exact doping concentration to be achieved is not critical, a high doping concentration of about $10^{19}$ arsenic atoms/cm$^3$ is sufficient to render the exposed portions of the source-to-drain path 16 and the control gate 30 sufficiently conductive. Note that the existence of the thin gate oxide 24 will not appreciably affect the implantation of the exposed portions of the source-to-drain path 16. FIGS. 9 and 10 show the resulting structure after the completion of the above processing steps.

The subsequent processing steps necessary to complete the manufacture of the SEMM 10 can be performed using industry standard techniques well known to those of ordinary skill in the art of semiconductor processing and therefore are only briefly described and not shown in the Figures. An interlevel dielectric such as an oxide is deposited over the surface of the resulting structure. Next, holes are etched through the interlevel dielectric and other oxides present to expose a portion of the source 18, the drain 20, and the control gate 30 of the SEMM 10. Next, a conductive layer (preferably aluminum) is sputtered onto the surface of the resulting structure such that the conductive layer comes into electrical contact with the source 18, drain 20, and control gate 30 through the contact holes. The conductive layer is then sintered in an inert forming gas of 30% hydrogen-70% nitrogen at 400 degrees Celsius for about 20 minutes. The purposes of the sintering process are two fold: first, it causes the metal to diffuse into and alloy with the silicon in the source 18, drain 20, and control gate 30 to provide a suitably low-resistance contact to these regions; and second, it removes any interface states present at the gate oxide 24/channel region 22 interface, thus providing more stable electrical operation of the SEMM device. Thereafter, the metal can be patterned and etched to produce leads connected to the source 18, drain 20, and control gate 30 contacts. Then a suitable passivating layer (such as an oxide or nitride) can be deposited over the resulting structure with holes etched therethrough to receive the signals necessary to operate the device (e.g., from bonding wires or probe tips).

B. Characterization/Experimental Results:

A batch of about thirty SEMM devices were fabricated as described above using the modified electron microscope for EBL. These SEMM devices were characterized at room temperature using a two-step process. First, a positive voltage pulse (i.e., a charging voltage, $V_{charge}$) relative to the grounded source was applied to the control gate 30, while the drain voltage was maintained at 50 mV (millivolts). This process causes electrons to tunnel from the channel region 22 to the floating gate 26. Second, the I–V characteristics of the SEMM 10 were measured by monitoring the source-to-drain current ($I_{ds}$) flowing through the source-to-drain path 16 as a function of control gate voltage ($V_{cg}$), using a 50 mV source-to-drain voltage. The I–V characteristics reveal the threshold voltage ($V_t$) of the device, defined as the $V_{cg}$ value at which $I_{ds}$=100 pA. A simple switching circuit was used to allow I–V measurements to be taken within 1 second after the charging process was completed.

Figure 11:
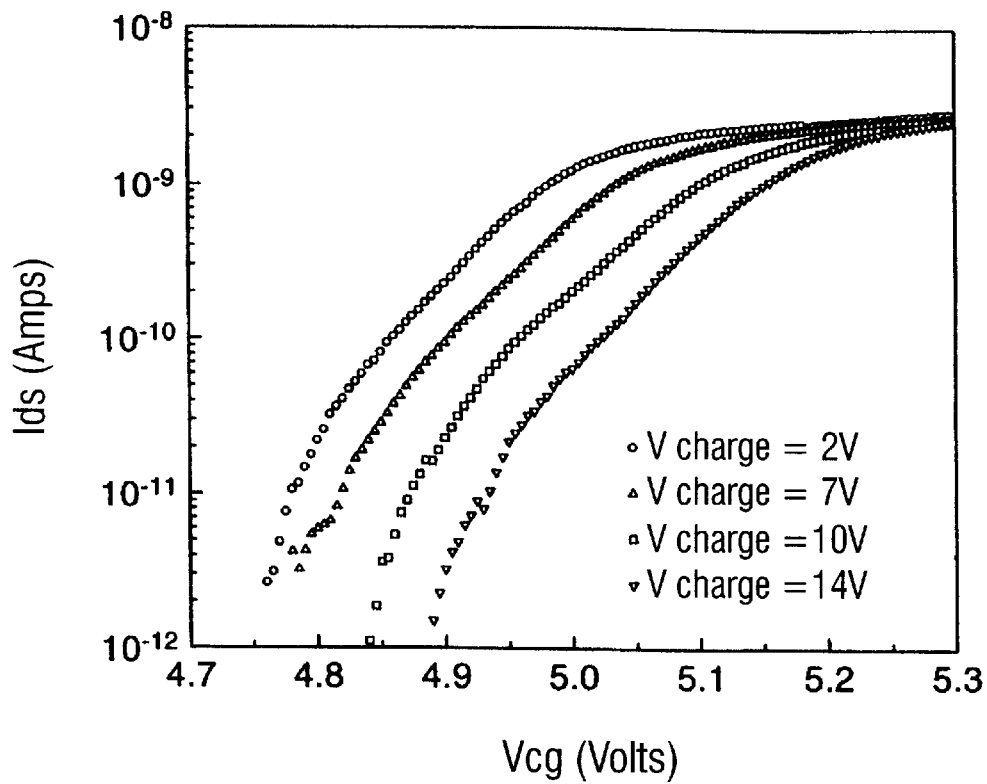
FIG. 11 shows the I–V characteristics of the SEMM of FIG. 1 after the application of several charging voltages.
Figure 12:
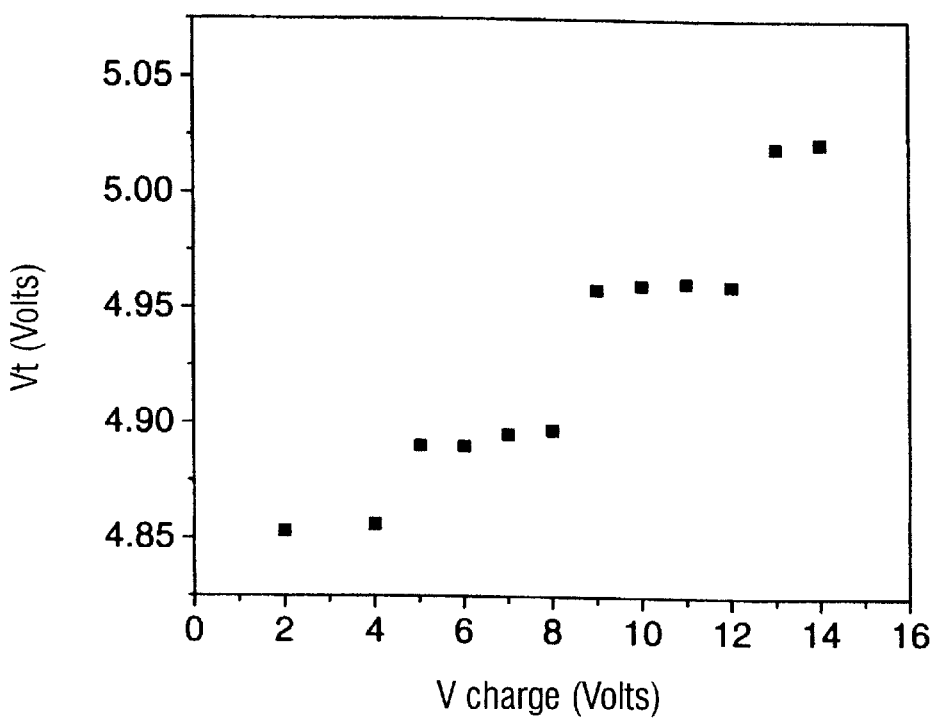
FIG. 12 shows the relationship between threshold voltage ($V_t$) and charging voltage for the SEMM of FIG. 1.
Figure 13:
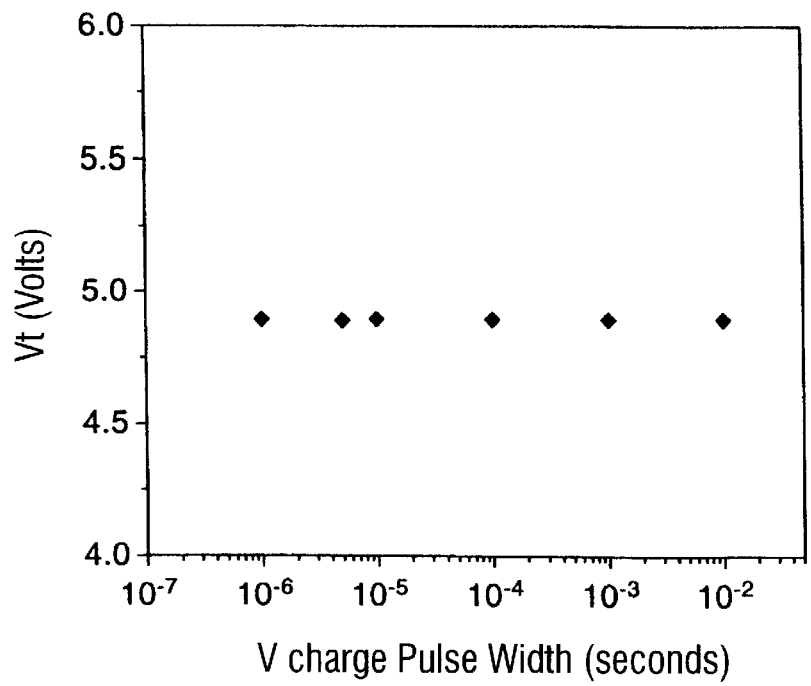
FIG. 13 shows the relationship between threshold voltage ($V_t$) and duration of charging pulse width for the SEMM of FIG. 1.

A SEMM 10 having a channel width 32 of about 10 nanometers and a floating gate 26 with dimensions 7 nanometers by 7 nanometers by 2 nanometers (the smallest device fabricated) was characterized after the application of different charging voltages. FIG. 11 shows the I–V characteristics of the device after the control gate 30 was pulsed for 10 ms with charging voltages ($V_{charge}$) of 2V, 7V, 10V and 14V. Note that as $V_{charge}$ is increased, the $V_t$ of the SEMM 10 increases by discrete steps of about 55 mV. FIG. 12 shows this same data in a different form, plotting $V_t$ versus $V_{charge}$. The 55 mV shifts can also be seen in FIG. 12, and discrete 55 mV shifts are seen when $V_{charge}$ increases by about 4 Volts. FIG. 13 shows that, for a given $V_{charge}$ (i.e., 10V), the $V_t$ shift is self-limited and is independent of the charging time (i.e., the $V_{charge}$ pulse width). This data shows that a discrete number of electrons (e.g., one when $V_{charge}$=5 to 8 Volts; two when $V_{charge}$=9 to 12 V; and three when $V_{charge}$=13 or greater) are stored on the floating gate 26. These electrons will tunnel back into the channel within about 5 seconds after the charging voltage is removed, although this phenomenon can be curtailed by increasing the thickness of the gate oxide 24.

Despite the extremely small floating gate 26 and the very low channel region 22 doping concentration, FIG. 11 shows that the disclosed SEMM 10 has a good subthreshold slope of 108 mV/decade. This results because the inversion layer induced by the control gate effectively acts as an ultra shallow source and drain for the SEMM 10, and also because the source-to-drain voltage is low.

It is noted that the discrete threshold shift is not due to interfacial traps at the gate oxide 24/channel region 22 interface. The threshold shifts due to these traps cannot provide equally spaced threshold shifts because the charges will be trapped at different locations in the channel. Furthermore, the charging of interface traps is known to be time dependent, see e.g. J. R. Davis, "Instabilities in MOS Devices," Gorden & Breach Science Publishers (1980), a characteristic not present in the experimental data (see FIG. 13).

1. The Vt v. Charging Voltage "Staircase" Function:

In the fabricated batch of SEMMs, no gate oxide was intentionally grown or deposited over the native oxide between the channel region 22 and floating gate 26, resulting in a very thin gate oxide 24. The reasons were two-fold: to allow fast charging of an electron onto the floating gate 26; and to minimize the potential difference between the channel region 22 and the floating gate 26 during the charging process. Minimization of the potential difference between the channel region 22 and the floating gate 26 allows the SEMM 10 to exploit a phenomenon know as the Coulomb Blockade Effect.

Figure 16:
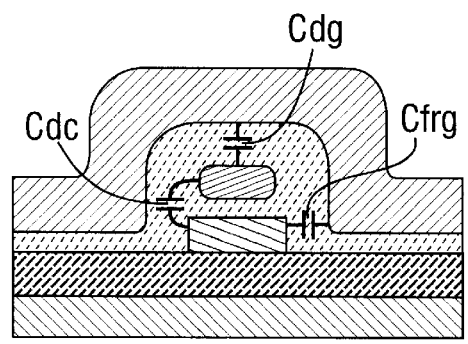
FIG. 16 shows a cross-sectional view of the SEMM of FIG. 1 and shows the SEMM's inherent capacitances.
Figure 14:
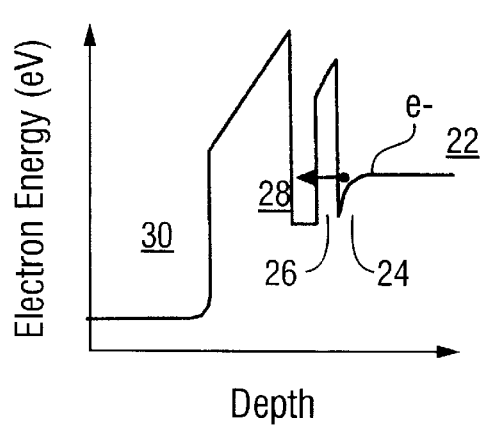
FIG. 14 shows an energy band diagram for the SEMM of FIG. 1 showing charging of a single electron onto the floating gate.
Figure 15:
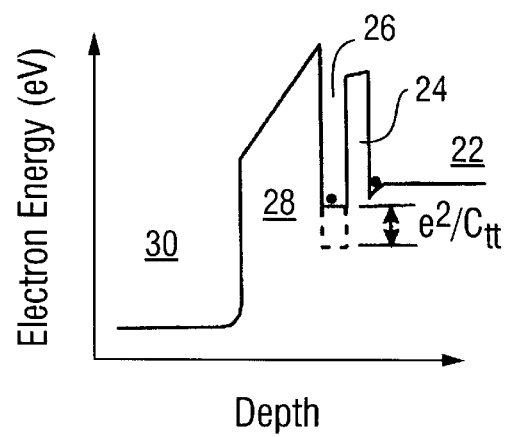
FIG. 15 shows an energy band diagram for the SEMM of FIG. 1 after a single electron has been charged onto the floating gate 26 and illustrates the Coulomb Blocking Effect by showing that the energy level inside of the floating gate 26 has been raised to prevent the charging of subsequent electrons.

In the Coulomb Blocking Effect, when a relatively high $V_{charge}$ (e.g., 5 to 8 Volts) is present on the control gate, an electron in the channel region 22 can tunnel through the gate oxide 24 and come to rest on the floating gate 26. The presence of the electron on the floating gate perturbs the electric field provided by $V_{charge}$ such that further electrons will not have an incentive to tunnel through the gate oxide 24. This is illustrated by the energy band diagrams of FIGS. 14 and 15. FIG. 14 shows the energy band diagram of the SEMM 10 when the floating gate 26 is being charged with an electron. FIG. 15 shows how the stored electron perturbs the electric field within the gate oxide 24, through which the electron must tunnel to reach the floating gate 24. Specifically, a stored electron will raise the energy level of the floating gate 26 by $q^2/C_{tt}$, where q=electron charge= $1.6*10^{-19}$ Coulombs, and $C_{tt}$=the total capacitance of the floating gate $\approx C_{dc}$, where $C_{dc}$ is the capacitance from the floating gate (or "dot") 26 to the channel region 22. (See FIG. 16 for a diagram of the capacitances inherent within the SEMM 10 that are helpful in understanding its operation). Therefore, the stored electron effectively screens the charging voltage $V_{charge}$ and prevents the formation of a tunneling field within the gate oxide 24, and thus a single electron can be stored onto the floating gate 26. Of course, the Coulomb Blockade Effect and the screening effect of the stored electron can be overcome by the addition of a higher $V_{charge}$ (e.g., 9–12V), which would then allow a second electron to tunnel onto the floating gate, as proven by the experimental data. Further increases in $V_{charge}$ (e.g., 13 V or greater) will overcome the screening effect of the two electrons to permit a third electron to tunnel onto the floating gate, and so on.

Because the gate oxide 24 is much thinner than the control gate oxide 28, almost all of the charging voltage $V_{charge}$ will be dropped across the control gate oxide 28. This means that, to add a single electron to the floating gate 26, a $V_{charge}= q/C_{dg}$ is required, where $C_{dg}$ is the capacitance between the control gate and the floating gate (FIG. 12). $C_{dg}$ for a 7 nanometer by 7 nanometer floating gate with 40 nanometers of control oxide is about $4.4*10^{-20}$ Farads, and therefore $q/C_{dg}$=3.6V, which is close to the experimental $V_{charge}$=4 to 5 Volts.

2. The Discrete 55 mV Vt Shift:

The shift in the SEMM's threshold voltage when one electron is stored on the floating gate 26 is governed by the equation: $\Delta V_t \approx q/(C_{dg}+C_{frg})$, where $C_{frg}$ is the fringe capacitance resulting from the wrapping of the control gate 30 around the channel region 22, such that the channel region 22 is only partially screened by the floating gate 26. For a conventional floating gate MOS memory, $C_{frg} \approx 0$, and $\Delta V_t \approx q/C_{dg}$. In the disclosed SEMM 10, $C_{frg}$ is about two orders of magnitude greater than $C_{dg}$, and can be estimated using a single-electron Debye screen length (about 70 nanometers; see below for a detailed discussion) and the channel thickness (about 26 nanometers) using a parallel-plate capacitor model. Accordingly, for a control gate oxide 28 thickness of 40 nanometers and an area of 70×26×2 nanometers squared, $C_{frg}$ is about $2.5*10^{-18}$ Farads, and $\Delta V_t \approx 64$ mV, which is consistent with the experimental value 55 mV shown in FIGS. 11 and 12.

As indicated by the equation shown above, the threshold voltage can be adjusted to be larger than 55 mV by increasing the control gate oxide 28 thickness to reduce $C_{dg}$, or by reducing $C_{frg}$.

Also, it should be noted that the 55 mV $V_t$ shift produced is significant and sufficiently distinct from expected thermal variations, therefore ensuring the reliability of exploiting the shift to produce effective memory cells. At room temperature, thermal variations will be on the order of kT/q, where T=300 Kelvin, and k=Boltzmann constant=$8.62*10^{-5}$ electron Volts/degree Kelvin, and q=electron charge= $1.6*10^{-19}$ Coulombs. This value at room temperature is about 26 mV, which is comfortably less than the 55 mV Vt shift.

3. Operational Physics:

Critical to the operation of the SEMM is the manufacture of the nanoscale floating gate 26. When the floating gate 26 is made sufficiently small, the energy levels within the floating gate 26 become quantized and separate. By further reducing the size of the floating gate 26, the energy spacing between these quantum levels becomes sufficiently large. Because the energy spacings are dictated by quantum mechanics and the solution of the Schrödinger Equation, it is difficult to quantify the exact floating gate 26 size that will produce a sufficient energy spacing within the floating gate 26. However, if the floating gate 26 is approximated to be a spherical "dot" with radius r, the energy spacing inside the dot is determined by the solution of the Schrödinger Equation. As a first order approximation, if the floating gate 26 is assumed to be a substantially flat "disk" of radius r, solutions to the Schrödinger Equation show that the energy level spacings within the floating gate "dot" are proportional to $1/r^2$. Solutions to the Schrödinger Equation are outlined in Stephen Gasiorowicz, "Quantum Physics," John Wiley & Sons, pp. 60–64, 78–79, 151–152 (1974), which is incorporated herein by reference in its entirety. Of course, as previously noted in section IV(B)(1) above, the energy levels in the floating gate "dot" are also a function of the coulomb charging energy=$q^2/C_{tt}$. Because $C_{tt}$ varies roughly linearly with r for thin dielectrics approaching the radius of the "dot," the coulomb charging energy is roughly proportional to 1/r. Thus, at vary small radii r, the quantum mechanical effects will dominate over coulomb charging effects.

Increasing the quantum energy level spacing within the floating gate 26 is important, because, for room temperature operation (i.e., about 300 degrees Kelvin), the quantum energy level spacing within the floating gate 26 must be significantly higher than the thermal energy of an electron, i.e., 26 mV. If not, a sufficiently "hot" electron will be able to overcome the energy barrier and appear on the floating gate, without the assistance and control of the charging voltage. This situation precludes the ability of storing a single electron in a controlled manner.

Using a SEMM 10 fabricated in the disclosed manner, the estimated quantum energy level spacing in the disclosed floating gate 26 is about 80 meV, or about 3 times the thermal energy of an electron at room temperature.

It is also critical to the operation of the device that a single electron stored on the floating gate 26 be able to modulate the conductivity of the channel such that a resolvable shift in $V_t$ results. More specifically, the channel width 32 must generally be smaller than the Debye screening length of a single electron stored on the floating gate 26. The Debye screening length, $L_D$ for the disclosed SEMM 10 is estimated to be about 70 nanometers, and is governed by the following equation:

$$L_D = \sqrt{(\varepsilon_S kT/q^2 N_B)}$$

where $\varepsilon_S$=permittivity of silicon (11.9*8.85×10$^{14}$ Farads/cm), k=Boltzmann constant, T=temperature (e.g., 300 degrees Kelvin), q=electron charge, and $N_B$=doping of the channel region 22 (e.g., 4×10$^{14}$ boron atoms/cm$^3$). Of course, this equation provides a simplified model and one of ordinary skill will realize that the Debye screening length in an operational device will vary from this ideal value, and may need to be experimentally determined. Because the channel width 32 of the disclosed SEMM 10 after oxidation is about 10 nanometers, a single electron can effectively modulate the channel conductivity, even when the control gate 30 is allowed to overlap the sides of the channel region 22. Furthermore, because the Debye screening length is much larger than the disclosed channel width 32, a SEMM device should be functional even when larger channel widths 32 are used, although the self-aligned structure of the SEMM 10 as disclosed assures that the channel width 32 is sufficiently small. As disclosed, the stored electron (or electrons) modulate the channel by causing the positive charges in the p-doped channel to be attracted to the gate oxide 24/channel region 22 interface. This in turn makes it more difficult for the voltage on the control gate ($V_{cg}$) to invert the channel region 22 to produce a sufficient source-to-drain current ($I_{ds}$) in the channel region 22 of the source-to-drain path 16, thus increasing the SEMM's $V_t$ (i.e., by 55 mV).

C. Conclusion:

A SEMM according to the invention has been shown useful for storing and detecting the presence of single electrons at room temperature. The SEMM is orders of magnitude smaller than conventional floating gate memories, has unique properties that conventional memories do not have, and constitutes a major step towards utilizing single electron effects to build ultra-small and ultra-high density transistor memories.

Those of ordinary skill in the art who now have the benefit of the present disclosure will appreciate that the present invention may take many forms and embodiments and have many uses. The structure and fabrication of the SEMM is well adapted to the manufacture of ultra large-scale integrated circuits. Moreover, those of ordinary skill will realize that the manufacturing details as set forth are merely one way of fabricating the SEMM, and that many other ways are possible which do not depart from the invention disclosed herein. For example, many different materials may be used in the fabrication of a SEMM of the present invention. Thus, the various dielectrics such as gate oxide 24 and control gate oxide 28 could also be formed of silicon nitride, tantalum dioxide or other suitable dielectric materials, or combinations thereof. Also, the floating gate could be formed of other suitably conductive materials, such as various metallic silicides (such as tungsten or titanium silicide). Other minor changes to the process are also possible without departing from the invention in any significant respect.

Accordingly, it is intended that the embodiments described herein should be illustrative only, and not limiting with respect to the scope of the present invention. Rather, it is intended that the invention encompass all modifications, equivalents and alternatives falling within the spirit and scope of the invention as defined by the appended claims.

What is claimed is:

1. A data storage device, comprising:

(a) a source-to-drain path including a channel region between a source and a drain, the channel region being comprised of a semiconductor;

(b) a single floating gate for storing at least one charge carrier, the floating gate being disposed over the channel region and isolated from the channel region by a first gate dielectric layer having a thickness of about 1 nanometer; and (c) a control gate disposed over the floating gate and isolated from the floating gate by a second gate dielectric layer so that a single charge carrier on the floating gate at room temperature produces a significant shift in threshold voltage of the channel region with respect to the control gate.

2. A data storage device, comprising:

(a) a source-to-drain path including a channel region between a source and a drain, the channel region being comprised of a semiconductor;

(b) a single floating gate disposed over the channel region and isolated from the channel region by a first gate dielectric layer having a thickness of about 1 nanometer, the floating gate having dimensions less than 10 nanometers by 10 nanometers by 10 nanometers for storing a single charge carrier; and (c) a control gate disposed over the floating gate and isolated from the floating gate by a second gate dielectric layer;

wherein the channel region has a width smaller than a Debye screening length of the single charge carrier stored on the floating gate.

3. A data storage device, comprising:

(a) a source-to-drain path including a channel region between a source and a drain, the channel region being comprised of a semiconductor, the channel region having a width of less than 70 nanometers;

(b) a single floating gate disposed over the channel region and isolated from the channel region by a first gate dielectric layer having a thickness of about 1 nanometer, the floating gate having dimensions less than 10 nanometers by 10 nanometers by 10 nanometers for storing a single charge carrier; and (c) a control gate disposed over the floating gate and isolated from the floating gate by a second gate dielectric layer.

4. A data storage device, comprising:

(a) a source-to-drain path including a channel region between a source and a drain, the channel region being a semiconductor, the channel region having a length from the source to the drain and also having a width;

(b) a floating gate for storing at least one charge carrier, the floating gate being disposed over the channel region and isolated from the channel region by a first gate dielectric layer having a thickness of about 1 nanometer, the floating gate having a width, wherein the width of the floating gate is self-aligned with the width of the channel; and (c) a control gate disposed over the floating gate and isolated from the floating gate by a second gate dielectric layer.

5. A data storage device, comprising:
(a) a source-to-drain path including a channel region between a source and a drain, the channel region being comprised of a semiconductor;
(b) a floating gate for storing at least one charge carrier, the floating gate being disposed over the channel region and isolated from the channel region by a first gate dielectric layer having a thickness of about 1 nanometer, the floating gate having lateral dimensions defined by lithography; and
(c) a control gate disposed over the floating gate and isolated from the floating gate by a second gate dielectric layer so that the single charge carrier on the floating gate at room temperature produces a significant shift in threshold voltage of the channel region with respect to the control gate.

* * * * *